United States Patent [19]
Makino et al.

[11] Patent Number: 5,311,078
[45] Date of Patent: May 10, 1994

[54] LOGIC CIRCUIT AND SEMICONDUCTOR DEVICE

[75] Inventors: Hiroshi Makino; Yasunobu Nakase; Kimio Ueda, all of Itami, Japan

[73] Assignee: Mitsubishi Denki Kabushiki Kaisha, Tokyo, Japan

[21] Appl. No.: 878,615

[22] Filed: May 5, 1992

[30] Foreign Application Priority Data

Nov. 12, 1991 [JP] Japan .................. 3-294739

[51] Int. Cl.$^5$ .................. H01L 29/78; H01L 29/02; H03K 19/02; H03K 19/08
[52] U.S. Cl. .................. 307/446; 257/378; 257/370
[58] Field of Search .................. 257/370, 378; 370/570, 370/475, 446

[56] References Cited

U.S. PATENT DOCUMENTS

| | | | |
|---|---|---|---|
| 4,103,188 | 7/1978 | Morton | 307/446 |
| 4,482,054 | 7/1987 | McLaughlin | 307/570 |
| 4,808,850 | 2/1989 | Masuda et al. | 307/570 |
| 4,816,705 | 3/1989 | Ohba et al. | 307/446 |
| 4,845,385 | 7/1989 | Ruth, Jr. | 307/570 |
| 5,059,821 | 10/1991 | Murabayashi et al. | 307/446 |
| 5,072,285 | 12/1991 | Ued et al. | 357/45 |
| 5,168,341 | 12/1992 | Kumagai et al. | 257/370 |

FOREIGN PATENT DOCUMENTS

| | | | |
|---|---|---|---|
| 60-21626 | 2/1985 | Japan | 307/570 |
| 61-93655 | 5/1986 | Japan | 257/370 |
| 63-244767 | 10/1988 | Japan | 257/370 |
| 3-136365 | 6/1991 | Japan | 257/370 |

OTHER PUBLICATIONS

1990 Symposium on VLSI Circuits, Dig. of Technical Papers, pp. 91-92, M. Fujishima, et al., "Appraisal of BiCMOS from Circuit Voltage and Delay Time".

The Transactions of the Institute of Electronics, Information and Communication Engineers, vol. J73-C-II, No. 12, pp. 867-875, Dec., 1990, (With English Abstract).

*Primary Examiner*—William D. Larkins
*Assistant Examiner*—Stephen D. Meier
*Attorney, Agent, or Firm*—Oblon, Spivak, McClelland, Maier & Neustadt

[57] ABSTRACT

In order to obtain a logic circuit capable of performing a high-speed operation, respective gates of a P-channel MOSFET (1) and an N-channel MOSFET (2) are connected to an input node (6) in common, and ends of resistors (12, 13) are connected to respective drains thereof. Respective emitters of an NPN transistor (3) and a PNP transistor (4) are connected to an output node (9) with an end of a resistor (5) in common, and ends of the resistors (12, 13) are connected to respective bases thereof. A source of the P-channel MOSFET (1) and a collector of the NPN transistor (3) are connected to a high potential point (8) in common while a source of the N-channel MOSFET (2) and a collector of the PNP transistor (4) are connected to a low potential point (40) in common respectively. Respective other ends of the resistors (5, 12, 13) are connected at a node (7) in common. Thus, the potential of an output terminal quickly fluctuates when a bipolar transistor is in an ON state.

22 Claims, 11 Drawing Sheets

LOGIC CIRCUIT AND SEMICONDUCTOR DEVICE

BACKGROUND OF THE INVENTION

1. Field of the Invention

The present invention relates to a semiconductor device and a logic circuit, and more particularly, it relates to a logic gate by BiCMOS.

2. Description of the Background Art

FIG. 12 is a circuit diagram showing a conventional BiCMOS inverter. A P-channel MOSFET 1 has a drain which is connected to a node 7, a gate which is connected to an input node 6, and a source which is connected to a high potential point 8 respectively. An N-channel MOSFET 2 has a drain which is connected to the node 7, a gate which is connected to the input node 6, and a source which is connected to a low potential point 40 (ground in this case) respectively. Therefore, the P-channel MOSFET 1 and the N-channel MOSFET 2 form a CMOS inverter, which inverts a logic (hereinafter referred to as "input logic") inputted in the input node 6 and supplies the same to the node 7.

An NPN transistor 3 has a collector which is connected to the high potential point 8, a base which is connected to the node 7, and an emitter which is connected to an output node 9 respectively. A PNP transistor 4 has a collector which is connected to the low potential point 40, a base which is connected to the node 7, and an emitter which is connected to the output node 9 respectively. A resistor 5 is connected between the output node 9 and the node 7. The structure of such an inverter is described in Denshi Joho Tsushin Gakkai Ronbun-shi Vol. J73-C-II, No. 12, 1990, p. 869, for example.

The operation of the inverter having the aforementioned structure is now described. It is assumed that the high potential point 8 is supplied with a potential of 5 V, while a high level of the input logic is 5 V and a low level thereof is 0 V.

When the input logic is at a high level (5 V), the P-channel MOSFET 1 enters an OFF state and the N-channel MOSFET 2 enters an ON state, whereby the potential at the node 7 is 0 V. When a transient state as described below is completed and the circuit enters a stationary state with no current flowing to the resistor 5, the potential of the output node 9 becomes equal to that of the node 7. Namely, the output node 9 outputs 0 V (low level), to provide an output obtained by inverting the input logic.

When the input logic is converted from the high level to a low level after such a stationary state, the P-channel MOSFET 1 first enters an ON state and then the N-channel MOSFET 2 enters an OFF state. Therefore, a current flows from the high potential point 8 to the node 7 through the P-channel MOSFET 1, to raise up the potential of the node 7. Since the potential of such a node 7 is generally changed at an extremely high speed (less than 1 ns), it is possible to raise up the same before the potential of the output node 9 is increased by setting the resistor 5 at a high resistance value to some degree. Thus, the potential of the node 7 is increased with respect to the output node 9.

Assuming that each of the NPN transistor 3 and the PNP transistor 4 has a base-to-emitter forward junction voltage $V_{BE}$ of 0.7 V, the NPN transistor 3 enters an ON state when potential difference between the node 7 and the output node 9 exceeds 0.7 V. Then, the potential of the output node 9 is rapidly raised up by a current which flows from the high potential point 8 to the output node 9 through the NPN transistor 3. However, the potential of the node 7 being increased only up to 5 V, that of the node 9 is merely raised to:

$$5(V) - 0.7(V) = 4.3(V) \tag{1}$$

by the current flowing through the NPN transistor 3. Thereafter the potential of the output node 9 is increased from 4.3 V to 5 V by a current which flows to the output node 9 through the P-channel MOSFET 1 and the resistor 5, and then the circuit enters a stationary state. The NPN transistor 3 is in an OFF state at this time.

As the resistance value of the resistor 5 is reduced, the current flowing to the output node 9 through the resistor 5 is increased to quickly raise up the potential of the output node 9. However, the value of the resistor 5 cannot be excessively reduced, since the base-to-emitter voltage $V_{BE}$ of the NPN transistor 3 must be maintained at 0.7 V. Therefore, the potential of the output node 9 is changed from 4.3 V to 5 V at a lower speed as compared with that for the increase from 0 V to 4.3 V.

While the potential of the output node 9 is raised up from the low level (0 V) to the high level (5 V), the PNP transistor 4 is regularly maintained in an OFF state and exerts no influence on the potential of the output node 9 since the potential of its base, i.e., the potential of the node 7 is higher than the potential (0 V) of its emitter.

When the input logic is converted from a low level (0 V) to a high level (5 V) in a stationary state, on the other hand, the N-channel MOSFET 2 and the PNP transistor 4 perform operations corresponding to the aforementioned operations of the P-channel MOSFET 1 and the NPN transistor 3 respectively, whereby the potential of the output node 9 is reduced from 5 V to 0.7 V and then loosely reduced further to 0 V.

Thus, it is understood that the BiCMOS inverter shown in FIG. 12 is the so-called full-swing inverter, which swings over the full range of 0 V to 5 V.

In such a structure, however, a load carrying capacitance which is caused by base capacitances of the NPN transistor 3 and the PNP transistor 4 is large enough to reduce the speed of the potential change of the node 7, since the node 7 is connected to the bases of the transistors 3 and 4. The potential of the output node 9 follows potential increase (or decrease) of the node 7 when the same is raised from 0 V up to 4.3 V (or reduced from 5 V to 0.7 V), and hence the change, i.e., the change of the outputted logic level, is also reduced in speed.

SUMMARY OF THE INVENTION

The present invention has been proposed in order to solve the aforementioned problem, and an object thereof is to obtain a logic circuit and a semiconductor device, each of which can output a logic level in a high-speed operation.

A logic circuit according to the present invention comprises first power source means, second power source means, at least one input terminal, an output terminal, a node, a first bipolar transistor having a first electrode which is connected to the first power source means, a second electrode which is connected to the output terminal and a first conductivity type control electrode, a second bipolar transistor having a first electrode which is connected to the second power source means, a second electrode which is connected to the output terminal and a second conductivity type control electrode, at least one first MOS transistor having a first conductivity type first current electrode which is connected to the control electrode of the first bipolar transistor, a first conductivity type second current electrode which is connected to the first power source means and a control electrode which is connected to any of the at least one input terminal, at least one second MOS transistor having a second conductivity type first current electrode which is connected to the control electrode of the second bipolar transistor, a second conductivity type second current electrode which is connected to the second power source means and a control electrode which is connected to any of the at least one input terminal, first resistant means having an end which is connected to the node and another end which is connected to the control electrode of the first bipolar transistor, second resistant means having an end which is connected to the node and another end which is connected to the control electrode of the second bipolar transistor, and third resistant means having an end which is connected to the node and another end which is connected to the output terminal.

A semiconductor device according to the present invention comprises a semiconductor substrate having a first conductivity type first semiconductor region for formation of elements and a second conductivity type second semiconductor region for formation of elements, a first MOS transistor being formed in the second semiconductor region and having a first conductivity type first current electrode, a first conductivity type second current electrode and a control electrode, a first bipolar transistor being formed in the second semiconductor region and having a second conductivity type first electrode, a second conductivity type second electrode and a first conductivity type control electrode, a second MOS transistor being formed in the first semiconductor region and having a second conductivity type first current electrode, a second conductivity type second current electrode and a control electrode, a second bipolar transistor being formed in the first semiconductor region and having a first conductivity type first electrode, a first conductivity type second electrode and a second conductivity type control electrode, first resistant means, second resistant means, and third resistant means. Both of the first current electrode of the first MOS transistor and the control electrode of the first bipolar transistor are connected to an end of the first resistant means and both of the first current electrode of the second MOS transistor and the control electrode of the second bipolar transistor are connected to an end of the second resistant means, while both of the second current electrodes of the first and second bipolar transistors are connected to an end of the third resistant means and the other ends of the first, second and third resistant means are connected in common.

Another semiconductor device according to the present invention comprises a semiconductor substrate having a first conductivity type first semiconductor region for formation of elements and a second conductivity type second semiconductor region for formation of elements, a first MOS transistor being formed in the second semiconductor region and having a first conductivity type first current electrode, a first conductivity type second current electrode and a control electrode, a first bipolar transistor being formed in the second semiconductor region and having a second conductivity type first electrode, a second conductivity type second electrode and a first conductivity type control electrode, a second MOS transistor being formed in the first semiconductor region and having a second conductivity type first current electrode, a second conductivity type second current electrode and a control electrode, a second bipolar transistor being formed in the first semiconductor region and having a first conductivity type first electrode, a first conductivity type second electrode and a second conductivity type control electrode, first resistant means, second resistant means and third resistant means. All of the first resistant means, the control electrode of the first bipolar transistor and the first current electrode of the first MOS transistor are formed by a first conductivity type third semiconductor region selectively formed in the second semiconductor region and all of the second resistant means, the control electrode of the second bipolar transistor and the first current electrode of the second MOS transistor are formed by a second conductivity type fourth semiconductor region selectively formed in the first semiconductor region, while an end of the third resistant means is connected to the second electrodes of the first and second bipolar transistors in common and the other end thereof is connected to the third and fourth semiconductor regions in common.

The first and second resistant means charge/discharge one of the base capacitances of the first and second bipolar transistors at a higher speed than that for the other base capacitance with a constant current, whereby the potential of the first base capacitance is changed at a higher speed than that required for charging/discharging both base capacitances at the same speed.

Further, since the control electrode of the first bipolar transistor and the first current electrode of the first MOS transistor have the third semiconductor region in common while the control electrode of the second bipolar transistor and the first current electrode of the second MOS transistor have the fourth semiconductor region in common, whereby it is possible to reduce base capacitances parasitic to the first and second bipolar transistors respectively.

According to the inventive logic circuit, as hereinabove described, the first and second resistant means are connected between the control electrodes of the two complementarily operating bipolar transistors to control charging/discharging speeds for capacitances parasitic to the control electrodes of the bipolar transistors, thereby enabling high-speed operations.

According to the inventive semiconductor device, further, it is possible to implement the aforementioned logic circuit to reduce the capacitances parasitic to the control electrodes, thereby further enabling high-speed operations.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
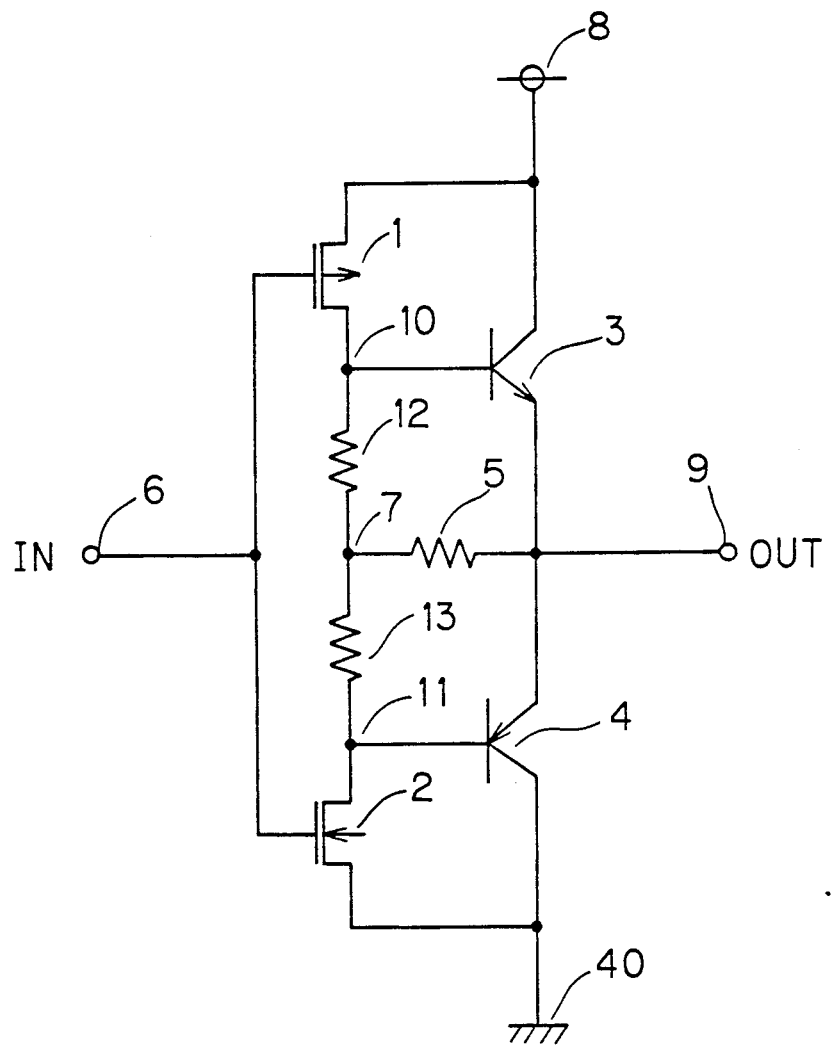
FIG. 1 is a circuit diagram showing an inverter according to a first embodiment of the present invention.

FIG. 1 is a circuit diagram showing a BiCMOS inverter according to a first embodiment of the present invention. An NPN transistor 3 has a collector which is connected to a high potential point 8 with a source of a P-channel MOSFET 1, an emitter which is connected to an output node 9 with an end of a resistor 5, and a base which is connected to an end of a resistor 12 with a drain of the P-channel MOSFET 1 respectively. A PNP transistor 4 has a collector which is connected to a low potential point 40 (ground in this case) with a source of an N-channel MOSFET 2, an emitter which is connected to the output node 9, and a base which is connected to an end of a resistor 13 with a drain of the N-channel MOSFET 2.

Gates of the P-channel and N-channel MOSFETs 1 and 2 are connected to an input node 6 in common. Respective other ends of the resistors 5, 12 and 13 are connected to a node 7 in common.

Figure 12:
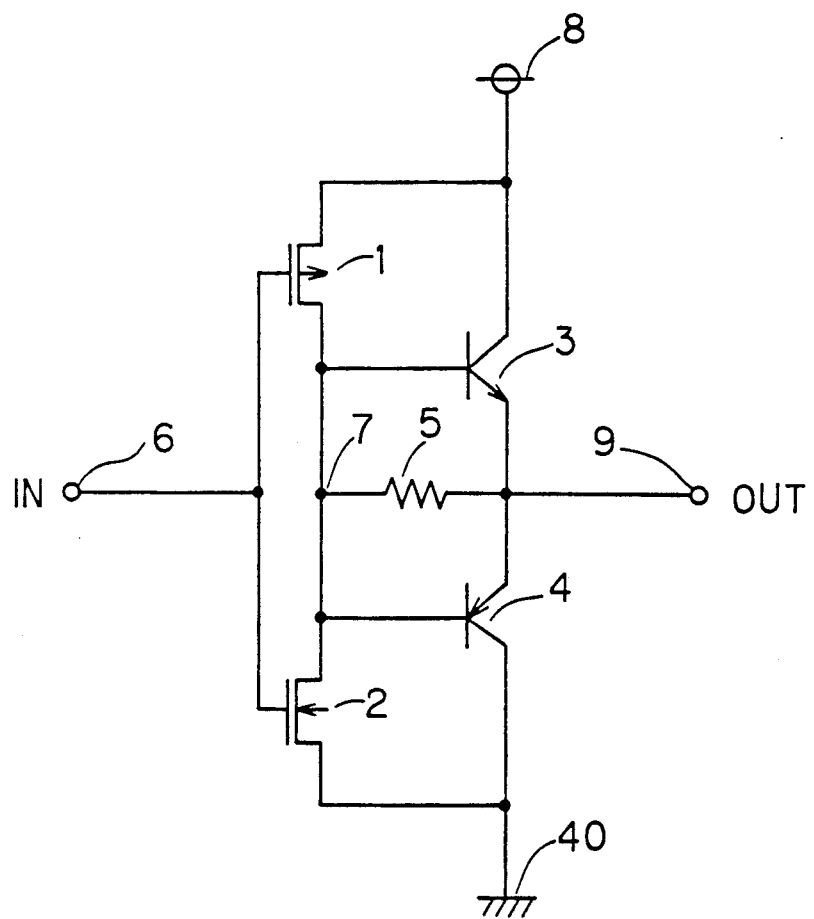
FIG. 12 is a circuit diagram for illustrating the prior art.

A schematic operation of the circuit having the aforementioned structure is similar to that of the conventional inverter shown in FIG. 12. It is assumed here that the high potential point 8 is supplied with a potential of 5 V, and a high level and a low level of an input logic are 5 V and 0 V respectively. The potential of the output node 9 is increased from 0 V to 4.3 V by a current flowing in the NPN transistor 3, and from 4.3 V to 5 V by a current flowing in the resistor 5 respectively. On the other hand, the potential of the output node 9 is reduced from 5 V to 0.7 by a current flowing in the PNP transistor 4, and from 0.7 V to 0 V by the current flowing in the resistor 5 respectively. However, the potential is increased from 0 V to 4.3 V and reduced from 5 V to 0.7 V at a higher speed than that in the inverter shown in FIG. 12.

Suppose that the potential of the output node 9 is increased, for example. When the circuit shown in FIG. 1 is in a stationary state with an input logic of a high level (5 V), the P-channel MOSFET 1 is in an OFF state and the N-channel MOSFET 2 is in an ON state, whereby no current flows to the resistor 5 and the potentials of the node 7 and the output node 9 are equally at 0 V (low level). Namely, a logic obtained by inverting the input logic is outputted.

When the input logic is thereafter converted from the high level to a low level, the P-channel MOSFET 1 first enters an ON state, and the N-channel MOSFET 2 enters an OFF state. Thus, a current flows from the high potential point 8 to the node 7 through the P-channel MOSFET 1 and the resistor 12, to raise up the potential of the node 7. While the base capacitance of the NPN transistor 3 is charged at this time, that of the PNP transistor 4 is also charged through the resistors 12 and 13. While the base capacitances of the transistors 3 and 4 are also charged in the conventional inverter shown in FIG. 12, these base capacitances are similarly charged since the drains of the MOSFETs 1 and 2 are directly coupled to each other and not through the resistors 12 and 13. According to this embodiment, however, the base capacitance of the NPN transistor 3 is charged at a speed lower than that for the base capacitance of the PNP transistor 4 when the potential of the node 7 is increased, whereby the potential of the base of the NPN transistor 3 is quickly raised up. This is now described with reference to FIGS. 2 to 4.

Figure 2:
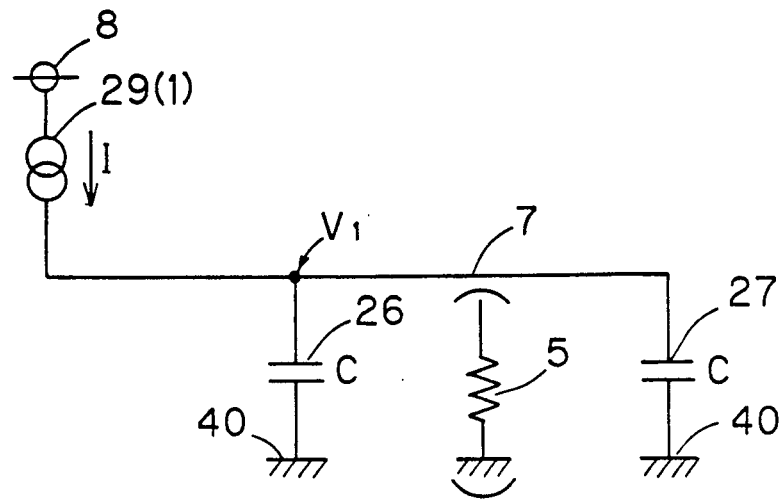
FIG. 2 is a circuit diagram for illustrating the prior art.
Figure 3:
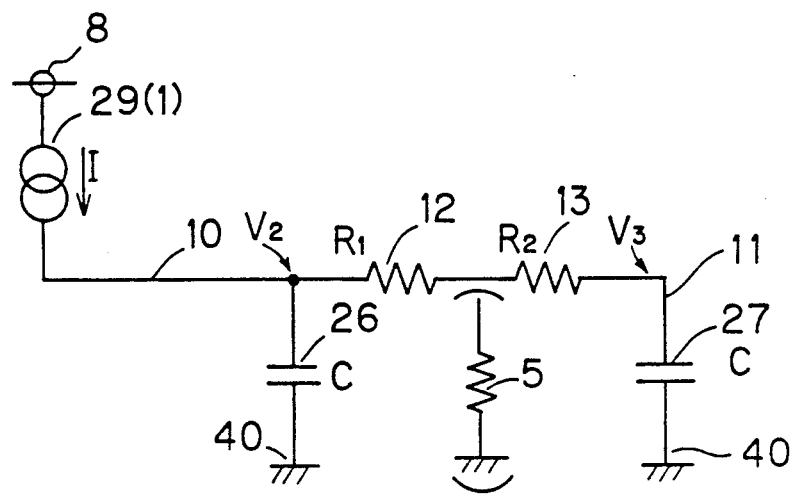
FIG. 3 is a circuit diagram for illustrating the operation of the first embodiment.

FIGS. 2 and 3 are equivalent circuit diagrams corresponding to FIGS. 12 and 1 respectively. In each of these figures, it is considered that the N-channel MOSFET 2 and the PNP transistor 4 are in OFF states, and the P-channel MOSFET 1, which is in an ON state, can be regarded as a constant current source 29 feeding a constant current I. Further, base currents flowing to the transistors 3 and 4, which are sufficiently small as compared with the current I and exert small influences if the resistor 5 is set at a large value to some degree, are not taken into consideration.

For the purpose of simplification, it is assumed that base capacitances 26 and 27 of the NPN transistor 3 and the PNP transistor 4 have values C and the resistors 12 and 13 have resistance values $R_1$ and $R_2$ respectively.

In the conventional circuit, the base capacitances 26 and 27 are connected in parallel with each other, and the high potential point 8 is connected to the node 7, which is one end thereof, through the constant current source 29. The other ends of the base capacitances 26 and 27 are grounded. It is assumed that the potential of the node 7 is 0 V in a stationary state and the constant current source 29 feeds the current I at a time $t_1$. This corresponds to such a fact that the circuit has been in a stationary state with the input logic of a low level in advance of a time $t_1$, and the input logic goes high at the time $t_1$. In such an operation, the following equation holds in relation to the potential $V_1$ of the node 7:

$$\frac{dQ_1}{dt} = I, \quad Q_1 = 2CV_1 \qquad (2)$$

where $Q_1$ represents the total amount of charges stored in the base capacitances 26 and 27. From the equation (2), the following equation holds:

$$\frac{dV_1}{dt} = \frac{I}{2C} \qquad (3)$$

Figure 4:
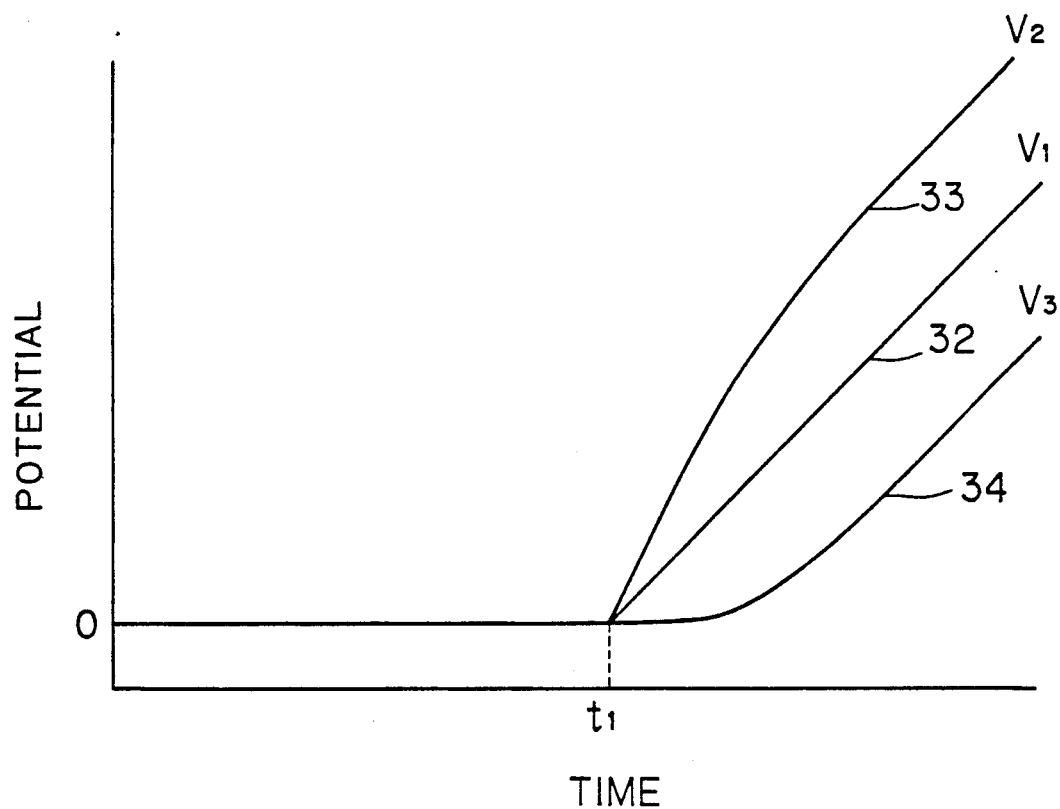
FIG. 4 is a graph for illustrating the operation of the first embodiment.

Thus, it is understood that the potential $V_1$ of the node 7 is increased at a constant speed after the time $t_1$. FIG. 4 shows this state with a curve 32.

According to this embodiment, on the other hand, the base capacitance 26 is directly connected to the constant current source 29 at the node 10, while the base capacitance 27 is connected with the resistor 13 at the node 11 and connected to the constant current source 29 at the node 10 through the resistors 12 and 13. Therefore, the following equations hold in relation to potentials $V_2$ and $V_3$ of the node 10 and 11:

$$\frac{dQ_2}{dt} + \frac{dQ_3}{dt} = I, Q_2 = CV_2, Q_3 = CV_3, \quad (4)$$

$$V_2 - V_3 = (R_1 + R_2)\frac{dQ_2}{dt}$$

where $Q_2$ and $Q_3$ represent amounts of charges stored in the base capacitances 26 and 27 respectively. When the amounts $Q_2$ and $Q_3$ of charges are eliminated from the equations 4 and the following equation is given as a boundary condition:

$$\left(\frac{dV_3}{dt}\right)_{t=t_1} = 0 \quad (5)$$

the speeds of increase of the potentials $V_2$ and $V_3$ are obtained as follows:

$$\frac{dV_2}{dt} = \frac{I}{2C}\left[1 + \exp\left(-\frac{2(t-t_1)}{RC}\right)\right], \quad (6)$$

$$\frac{dV_3}{dt} = \frac{I}{2C}\left[1 - \exp\left(-\frac{2(t-t_1)}{RC}\right)\right],$$

$$R = R_1 + R_2$$

FIG. 4 shows the states of such increase of the potentials $V_2$ and $V_3$ with curves 33 and 34 respectively.

As understood form the curves shown in FIG. 4, the increase speed of the potential $V_2$ of the node is higher than that of the potential $V_1$ of the node 7 immediately after the time t1. Substituting t=t1 into the equation 6, to obtain:

$$\left(\frac{dV_2}{dt}\right)_{t=t_1} = \frac{I}{C} \quad (7)$$

whereby it is understood that the increase speed of the potential $V_2$ is twice that of the potential $V_1$. The increase speed of the potential $V_2$ approaches that (I/2C) of the potential $V_1$ with time. The increase speed of the potential $V_3$ of the node 11 is 0 immediately after the time $t_1$, and approaches I/2C with time.

When the potential of the node 10 is increased in the aforementioned manner, that of the output node 9 is also increased at the same speed. This is because potential difference between the node 10 and the output node 9 is equal to a base-to-emitter voltage $V_{BE}$ of the NPN transistor 3 and substantially maintained at 0.7 V. Such a voltage $V_{BE}$ is held if a base current flows to the NPN transistor 3 to bring the same into an ON state. According to this embodiment, therefore, the increase speed is improved in a period when the NPN transistor 3 is in an ON state, i.e., in a period when the potential of the output node 9 is increased from 0 V to 4.3 V.

When the input logic is converted to a high level (5 V) from a low level in the stationary state of the circuit shown in FIG. 1, on the other hand, the potential of the output node 9 is quickly reduced from 5 V to 0.7 V. The base capacitance 27 is discharged at a higher speed than the base capacitance 26, whereby the potential of the node 11 is quickly reduced and that of the output node 9 is also quickly reduced through a base-to-emitter voltage $V_{BE}$ of the PNP transistor 4.

Figure 5:
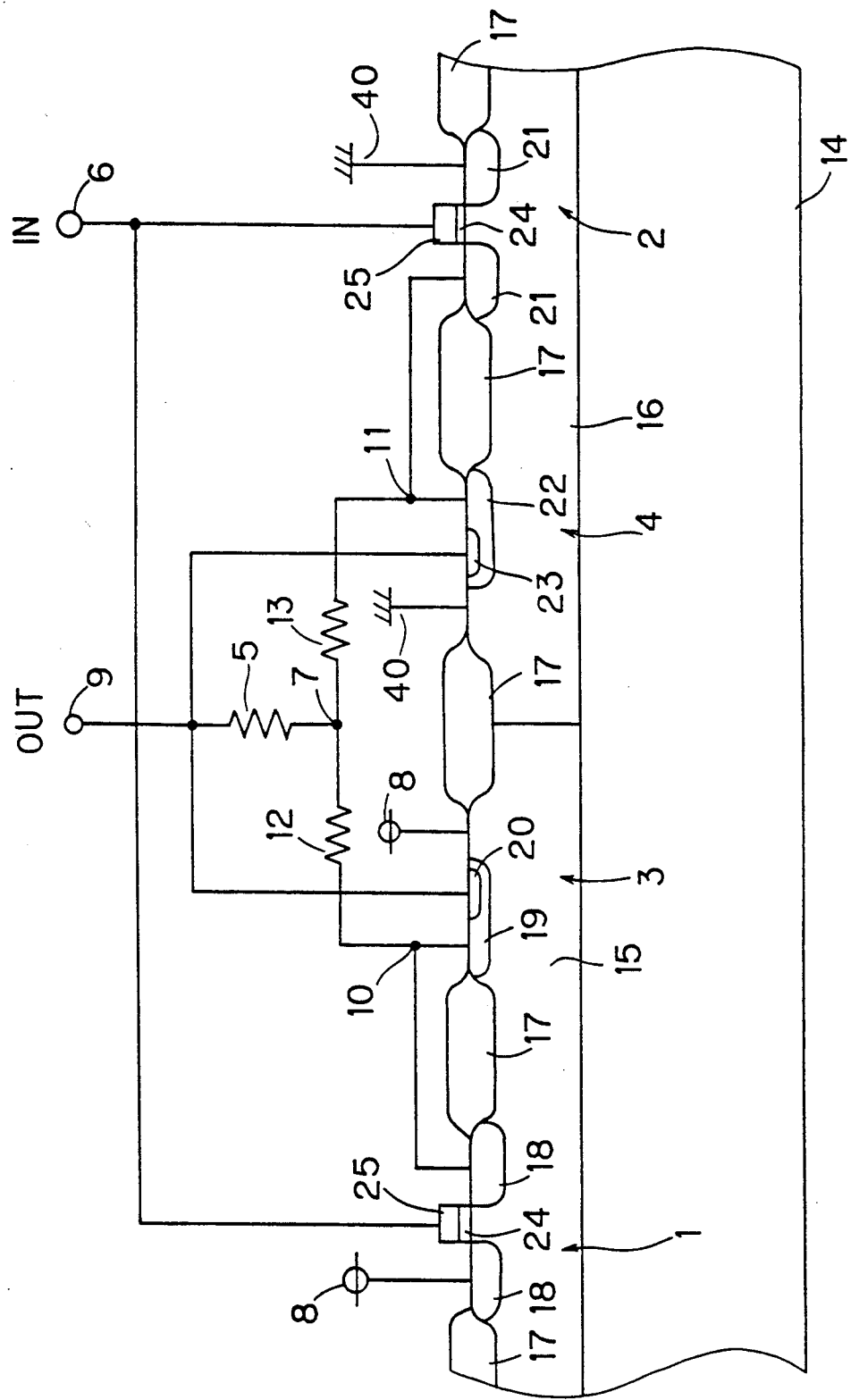
FIG. 5 is an explanatory diagram of a semiconductor device according to a second embodiment of the present invention.

FIG. 5 shows a semiconductor device according to a second embodiment of the present invention, which can implement the BiCMOS inverter having the structure shown in FIG. 1.

FIG. 5 illustrates a section of a semiconductor device which is provided with a P-channel MOSFET 1, an N-channel MOSFET 2, an NPN transistor 3 and a PNP transistor 4 in a monolithic manner, with connection of resistors 5, 12 and 13, an input node 6 and an output node 9.

A silicon substrate 14 is provided thereon with an N-type impurity region 15 serving as an N-type well and a P-type impurity region 16 serving as a P-type well, so that the P-channel MOSFET 1 and the NPN transistor 3 are formed in the N-type well 15 and the N-channel MOSFET 2 and the PNP transistor 4 are formed in the P-type well 16 respectively. These elements are isolated from each other by an isolation oxide film 17.

The P-channel MOSFET 1 has P-type impurity regions 18 serving as a source and a drain respectively, a gate oxide film 24, and a gate electrode 25. The NPN transistor 3 has the N-type well 15 as a collector, a P-type impurity region 19 serving as a base, and an N-type impurity region 20 serving as an emitter.

The N-channel MOSFET 2 has N-type impurity regions 21 serving as a source and a drain respectively, a gate oxide film 24, and a gate electrode 25. The PNP transistor 4 has the P-type well 16 as a collector, an N-type impurity region 22 serving as a base, and a P-type impurity region 23 serving as an emitter.

One of the P-type impurity regions 18 is connected to a node 10 with the P-type impurity region 19 and an end of the resistor 12. The other P-type impurity region 18 is connected to a high potential point 8 with the N-type well 15. One of the N-type impurity regions 21 is connected to a node 11 with the N-type impurity region 22 and an end of the resistor 13. The other N-type impurity region 21 is connected to a low potential point 40 with the P-type well 16. The other ends of the resistors 12 and 13 are connected to a node 7 in common. An end of the resistor 5 is also connected to the node 7, while the other end of the resistor 5 is connected to the output node 9 with the N-type impurity region 20 and the P-type impurity region 23. Both gate electrodes 25 are connected to the input node 6.

While FIG. 5 shows only reference symbols of the resistors 5, 12 and 13, such resistors can be easily formed on the silicon substrate 14 in a monolithic manner by polysilicon or wiring metal materials in a step of forming the gate electrodes 25 or a step of connecting the nodes 10 and 11 with the impurity regions 18, 19, 21 and 22. It is clearly understood that the semiconductor device having the aforementioned structure implements the operation of the logic circuit, which is an inverter, shown in FIG. 1. Namely, when the high potential point 8 is supplied with 5 V on the assumption that a high level is 5 V and a low level is 0 V, the output node 9 is quickly converted from a low level of 0 V to a high level of 4.3 V and from a high level of 5 V to a low level of 0.7 V to enable a high-speed operation for serving as a logic circuit.

As understood from the equations (3) and (7), base capacitances of the NPN transistor 3 and the PNP transistor 4 significantly hinder the high speed operation of the output node 9. If the base capacitances are reduced, therefore, it is possible to further increase the speed of the operation of the logic circuit shown in FIG. 1.

Figure 6:
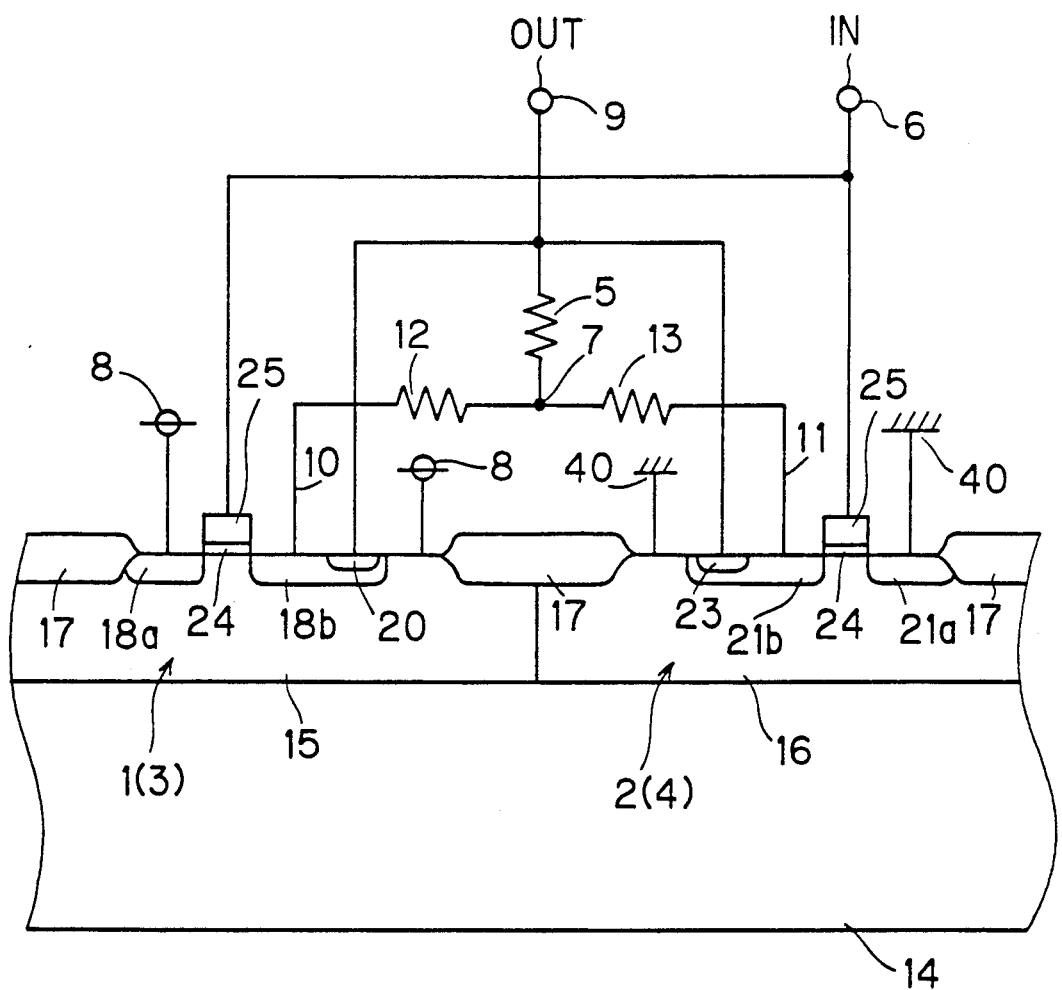
FIG. 6 is an explanatory diagram of a semiconductor device according to a third embodiment of the present invention.

FIG. 6 shows a semiconductor device according to a third embodiment of the present invention. Similarly to the second embodiment, an N-type well 15 and a P-type well 16 are provided on a silicon substrate 14, so that a P-channel MOSFET 1 and an NPN transistor 3 are formed in the N-type well 15 and an N-channel MOSFET 2 and a PNP transistor 4 are formed in the P-type well 16 respectively. Dissimilarly to the second embodiment, however, the P-channel MOSFET 1 is not isolated from the NPN transistor 3 by an interlayer isolation film 17 and the N-channel MOSFET 2 is not isolated from the PNP transistor 4 by an interlayer isolation film 17. The P-channel MOSFET 1 is fused with the NPN transistor 3 and the N-channel MOSFET 2 is fused with the PNP transistor 4 respectively.

Namely, no P-type impurity region 19 is needed dissimilarly to the second embodiment (FIG. 5), but a P-type impurity region 18b serves as a drain of the P-channel MOSFET 1 as well as a base of the NPN transistor 3. Further, no N-type impurity region 22 is needed but an N-type impurity region 21b serves as a drain of the N-channel MOSFET 2 as well as a base of the PNP transistor 4. A P-type impurity region 18a and an N-type impurity region 21a define sources of the P-channel MOSFET 1 and the N-channel MOSFET 2 respectively. According to such a structure, no connection is needed at the nodes 10 and 11 dissimilarly to the second embodiment, whereby it is possible to reduce base capacitances parasitic to the transistors 3 and 4.

Figure 7:
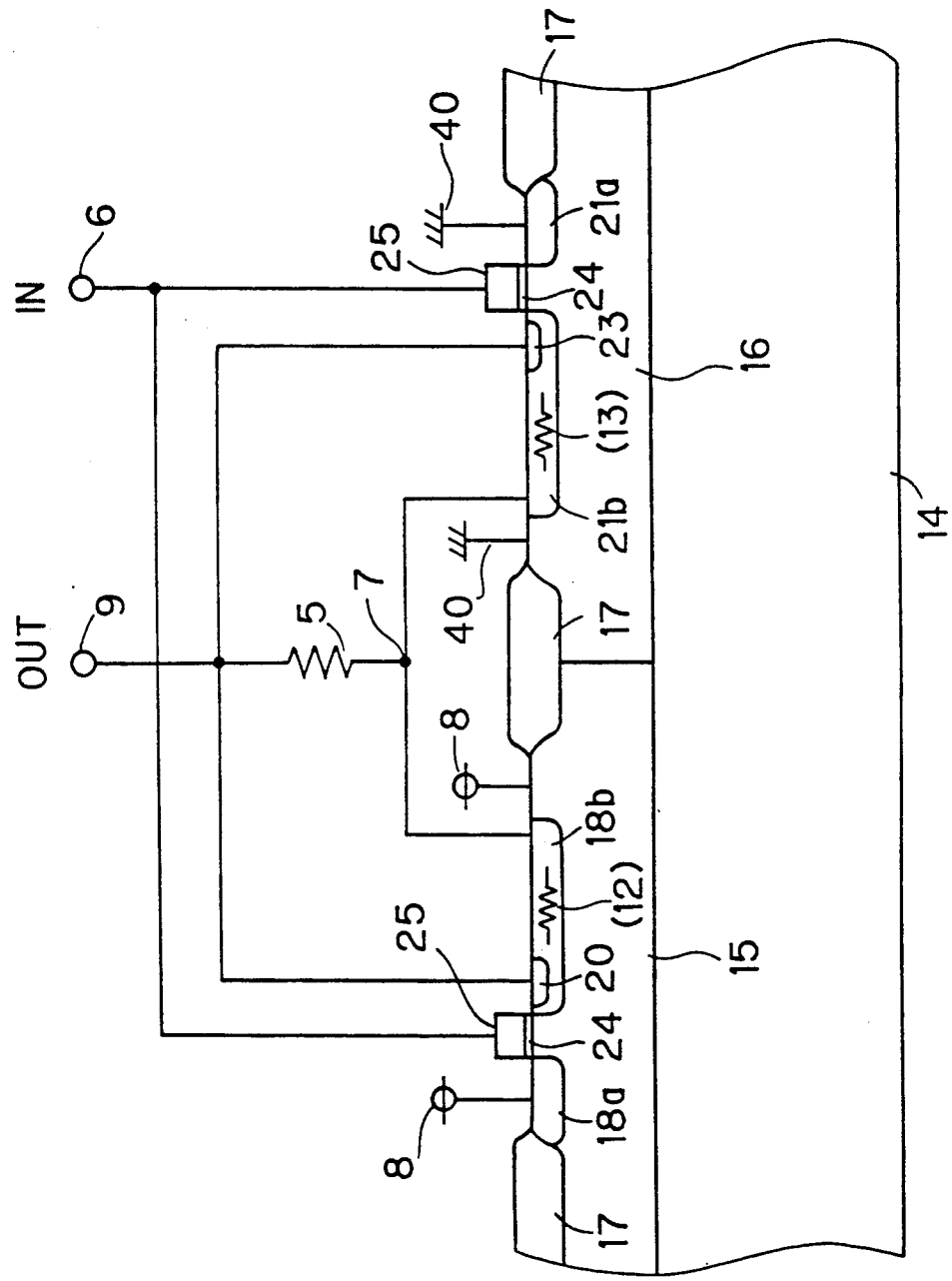
FIG. 7 is an explanatory diagram of a semiconductor device according to a fourth embodiment of the present invention.

FIG. 7 shows a semiconductor device according to a fourth embodiment of the present invention. Similarly to the third embodiment, a P-type impurity region 18b serves as a base of an NPN transistor 3 and an N-type impurity region 21b serves as a base of a PNP transistor 4, while these regions also serve as resistors 12 and 13.

Namely, the P-type impurity region 18b parasitically comprises the resistor 12, while the N-type impurity region 21b parasitically comprises the resistor 13. Formation of such parasitic resistors can be implemented by partially or entirely controlling the configurations and impurity concentrations of the P-type impurity region 18b and the N-type impurity region 21b. Due to such a structure, it is possible to further reduce base capacitances parasitic to the transistors 3 and 4.

Figure 8:
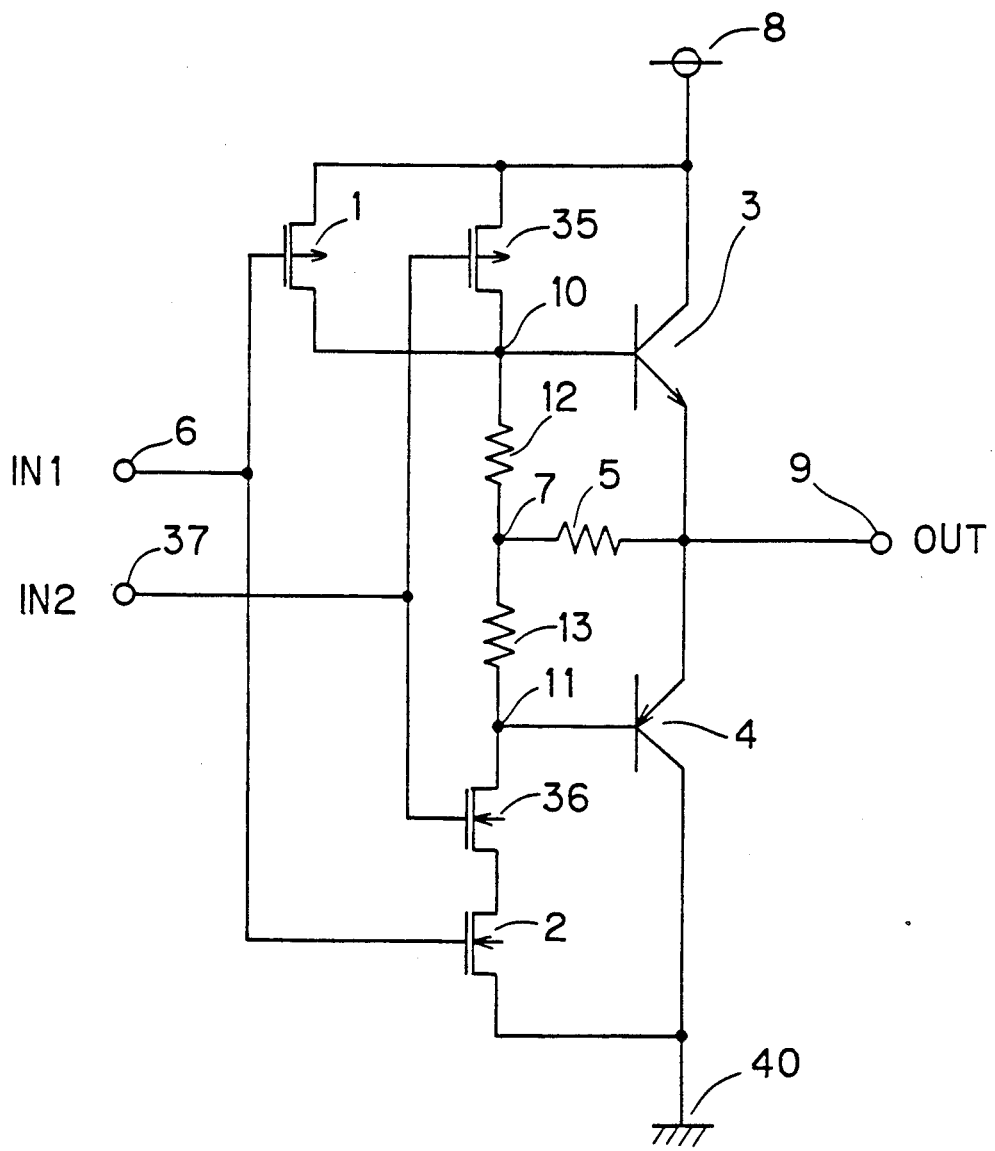
FIG. 8 is a circuit diagram showing a NAND circuit according to a fifth embodiment of the present invention.

The present invention is also applicable to a logic circuit other than an inverter. FIG. 8 is a circuit diagram showing a two-input NAND circuit according to a fifth embodiment of the present invention. P-channel MOSFETs 1 and 35 are connected in parallel with each other, while N-channel MOSFETs 2 and 36 are connected in series with each other.

Namely, a source of the P-channel MOSFET 35 is connected to a collector of an NPN transistor 3 with that of the P-channel MOSFET 1. These are further connected to a high potential point 8. A drain of the P-channel MOSFET 35 is connected to a base of the NPN transistor 3 with that of the P-channel MOSFET 1 at a node 10. A source and a drain of the N-channel MOSFET 36 are connected to a drain of the N-channel MOSFET 2 and a base of a PNP transistor 4 respectively. A source of the N-channel MOSFET 2 is connected to a low potential point 40 (ground in this case) with an emitter of the PNP transistor 4.

A base of the PNP transistor 4 is connected to an end of a resistor 13 at a node 11, while the other end of the resistor 13 is connected to a node 7 with an end of a resistor 5. The other end of the resistor 5 is connected to an output node 9 with emitters of an NPN transistor 3 and a PNP transistor 4. The node 10 is connected to the node 7 through a resistor 12.

Two inputs for this NAND circuit are received in an input node 6 to which gates of the P-channel MOSFET 1 and the N-channel MOSFET 2 are connected and an input node 37 to which gates of the P-channel MOSFET 35 and the N-channel MOSFET 36 are connected. When high-level input logics are supplied to both input nodes 6 and 37, both P-channel MOSFETs 1 and 35 enter OFF states and both N-channel MOSFETs 2 and 36 enter ON states, whereby the nodes 7, 10 and 11 and the output node 9 enter low levels. Afterward, when at least one of the input nodes 6 and 37 enters a low level, at least either one of the P-channel MOSFETs 1 and 35 enters an ON state and at least either one of the N-channel MOSFETs 2 and 36 enters an OFF state, whereby all of the nodes 7, 10 and 11 and the output node 9 enter high levels.

When an input logic which is supplied to the node 6 is converted from a high level to a low level, the P-channel MOSFET 1 acts as a constant current source to perform the same operation as that shown in the equivalent circuit diagram of FIG. 3, whereby the base capacitance of the NPN transistor 3 is quickly charged and the potential of the output node 9 is quickly increased so far as the NPN transistor 3 is in an ON state.

When both of the input nodes 6 and 37 are converted to high levels from such a stationary state that at least either one thereof is at a low level, on the other hand, the N-channel MOSFETs 2 and 36 serve as constant current sources and the base capacitance of the PNP transistor 4 is quickly discharged, whereby the potential of the output node 9 is quickly reduced. Thus, according to the fifth embodiment, it is possible to obtain a NAND circuit which is capable of a high speed operation.

Figure 9:
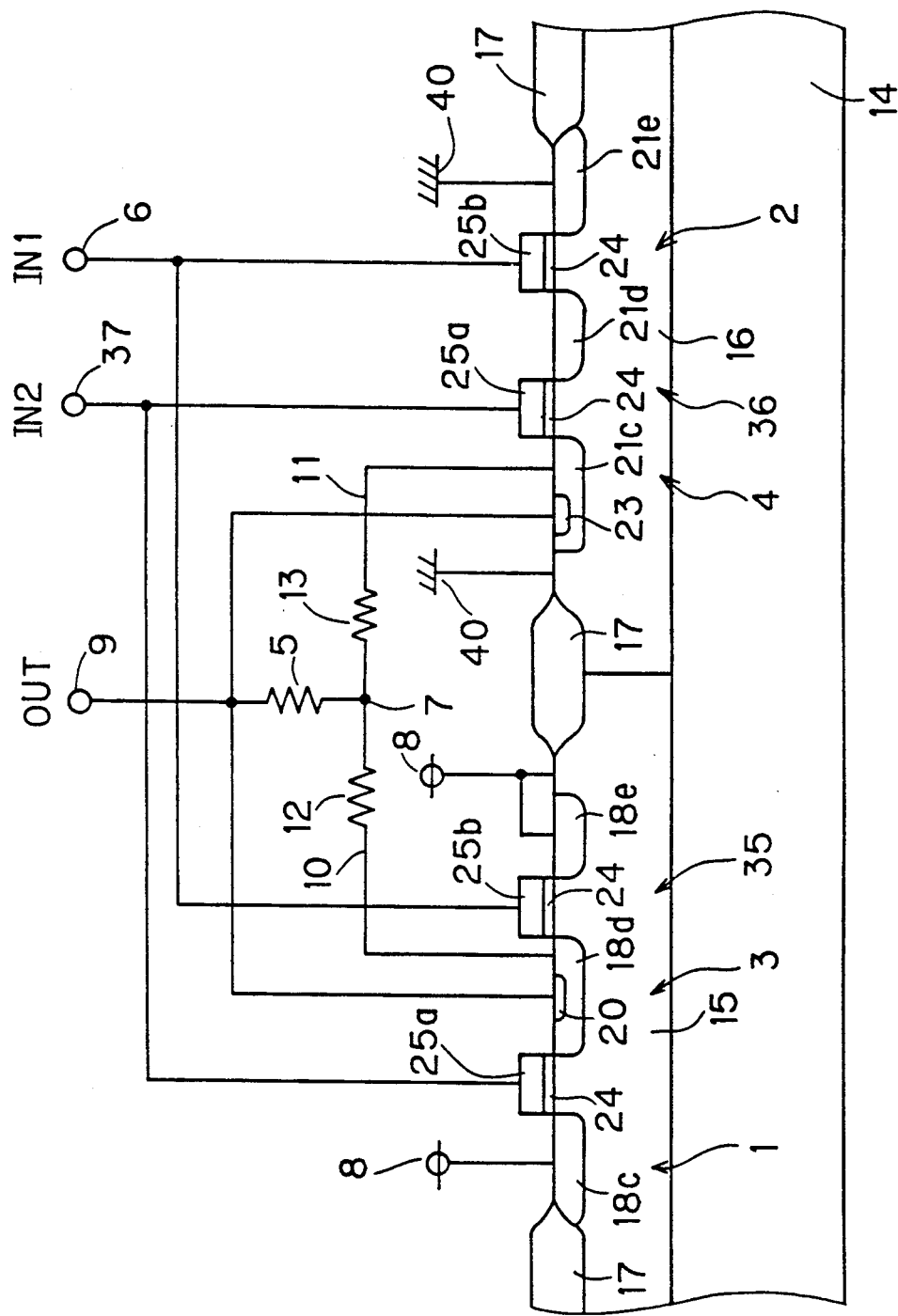
FIG. 9 is an explanatory diagram of a semiconductor device according to a sixth embodiment of the present invention.

FIG. 9 shows a semiconductor device according to a sixth embodiment for implementing the NAND circuit according to the fifth embodiment. While FIG. 9 shows only reference symbols of resistors 5, 12 and 13 similarly to FIG. 5 showing the second embodiment, such resistors can be easily formed on a silicon substrate by polysilicon or wiring metal materials. Similarly to the third embodiment (FIG. 6), there are P-type and N-type impurity regions commonly belonging to pluralities of transistors.

An N-type well 15 and a P-type well 16 are provided on a silicon substrate 14, so that P-channel MOSFETs 1 and 35 and an NPN transistor 3 are formed in the N-type well 15 and N-channel MOSFETs 2 and 36 and a PNP transistor 4 are formed in the P-type well 16 respectively. The P-channel MOSFET 1 has a P-type impurity region 18c serving as a source, a gate oxide film 24, a gate electrode 25a, and a P-type impurity region 18d serving as a drain. The P-channel MOSFET 35 has a P-type impurity region 18e serving as a source, a gate oxide film 24, a gate electrode 25b, and the P-type impurity region 18d serving as a drain. The NPN transistor 3 has the N-type well 15 as a collector, the P-type impurity region 18d serving as a base, and an N-type impurity region 20 serving as an emitter. Thus, the drain of the P-channel MOSFET 1, the base of the NPN transistor 3 and the drain of the P-channel MOSFET 35 are defined by the P-channel impurity region 18d in common.

The N-channel MOSFET 2 has an N-type impurity region 21e serving as a source, a gate oxide film 24, a gate electrode 25b, and an N-type impurity region 21d serving as a drain. The N-channel MOSFET 36 has the N-type impurity region 21d serving as a source, a gate oxide film 24, a gate electrode 25a, and an N-type impurity region 21c serving as a drain. The PNP transistor 4 has the P-type well 16 as a collector, the N-type impurity region 21c serving as a base, and a P-type impurity region 23 serving as an emitter.

Thus, the drain of the N-channel MOSFET 2 and the source of the N-channel MOSFET 36 are defined by the N-type impurity region 21d in common, while the drain of the N-channel MOSFET 36 and the base of the PNP transistor 4 are defined by the N-type impurity region 21c in common.

It is understood that the common P-type impurity region 18d is adapted to reduce the base capacitance of the NPN transistor 3 while the common N-type impurity region 21c is adapted to reduce that of the PNP transistor 4 respectively, to contribute to speed increase of the operations of the fifth and sixth embodiments similarly to the third embodiment.

While the resistors which are passive elements are inserted between the NPN transistor 3 and the node 7 as well as between the PNP transistor 4 and the node 7 in each of the first to sixth embodiments, the present invention is applicable also when these elements are replaced by MOSFETs.

Figure 10:
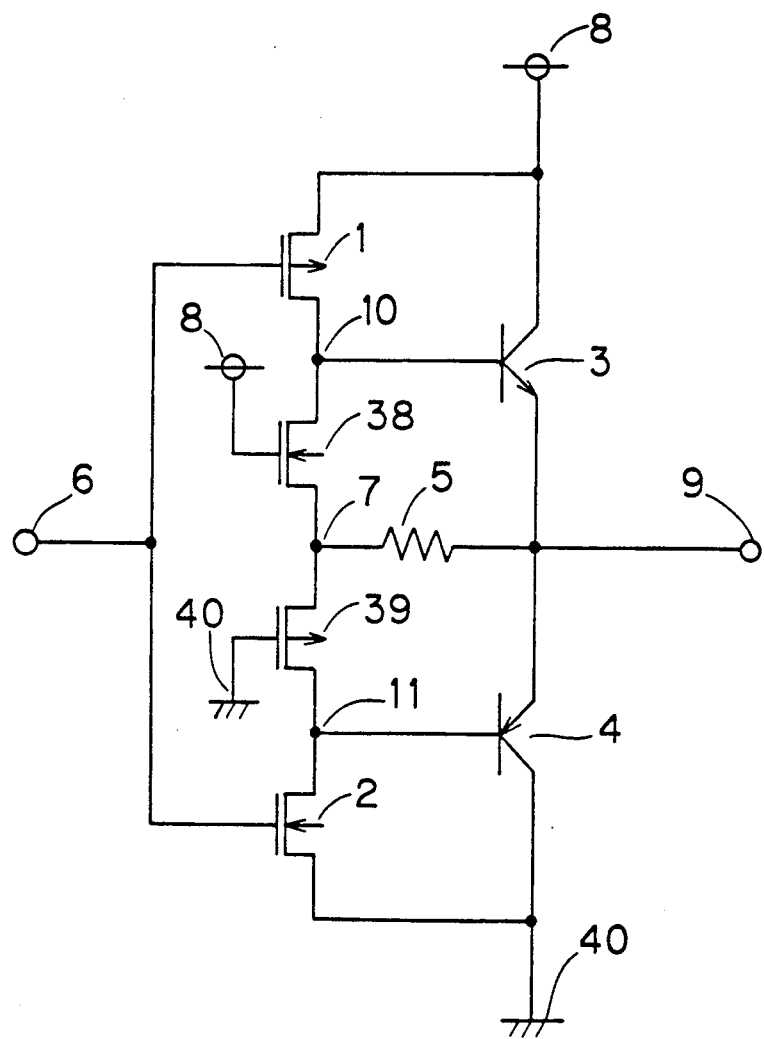
FIG. 10 is a circuit diagram showing an inverter according to a seventh embodiment of the present invention.

FIG. 10 is a circuit diagram showing an inverter according to a seventh embodiment of the present invention. In this embodiment, the resistors 12 and 13 of the first embodiment shown in FIG. 1 are replaced by an N-channel MOSFET 38 and a P-channel MOSFET 39 respectively. Namely, the N-channel MOSFET 38 has a drain which is connected to a node 10 with a drain of a P-channel MOSFET 1 and a base of an NPN transistor 3, a source which is connected to a node 7 with a resistor 5, and a gate which is connected to a high potential point 8. The P-channel MOSFET 39 has a drain which is connected to a node 11 with a drain of an N-channel MOSFET 2 and a base of a PNP transistor 4, a source which is connected to the node 7, and a gate which is connected to a low potential point 40 (ground in this case).

In the inverter having the aforementioned structure, an effect similar to that of the first embodiment can be attained since drain-to-source portions of the MOSFETs 38 and 39 serve as resistors when both of the same are in ON states.

The fluctuation width of the voltage at the node 7 is varied with the types of the MOSFETs 38 and 39. If the N-channel MOSFET 38 is of an enhancement type, i.e., if its threshold voltage $V_{TE}$ is positive, the N-channel MOSFET 38 enters an OFF state when the potential of the node 7 is increased to a level which is lower by the threshold voltage $V_{TE}$ from a high level (5 V equally to the high potential point 8, for example) and the potential of the node 7 will not be increased in excess thereof. If the P-channel MOSFET 39 is similarly of an enhancement type having a negative threshold voltage $V_{TP}$, the P-channel MOSFET 39 enters an OFF state when the potential of the node 7 is reduced to $-V_{TP}(>0)$ and the potential of the node 7 will not be reduced beyond the said level. When both MOSFETs 38 and 39 are of enhancement types having the aforementioned threshold values, therefore, the fluctuation width of the potential of the node 7 is as follows:

$$(5 - V_{TE}) - (-V_{TP}) = 5 - (V_{TE} - V_{TP}) < 5 \qquad (8)$$

$$(\because V_{TE} - V_{TP} > 0)$$

to be less than 5 V. In this case, the potential of the output node 9 fluctuates following the potential of the node 7, whereby its fluctuation width is also less than 5 V. When a full swing signal is transmitted to a next-stage circuit (not shown), the MOSFET 38 may be formed by a depression type transistor having a negative threshold voltage $V_{TE}$ and the P-channel MOSFET 39 may be formed by a depression type transistor having a positive threshold value $V_{TP}$.

When no full swing signal is transmitted to the next-stage circuit but difference between high and low levels is to be arbitrarily set at the output node 9, the threshold values $V_{TE}$ and $V_{TP}$ may be controlled.

Figure 11:
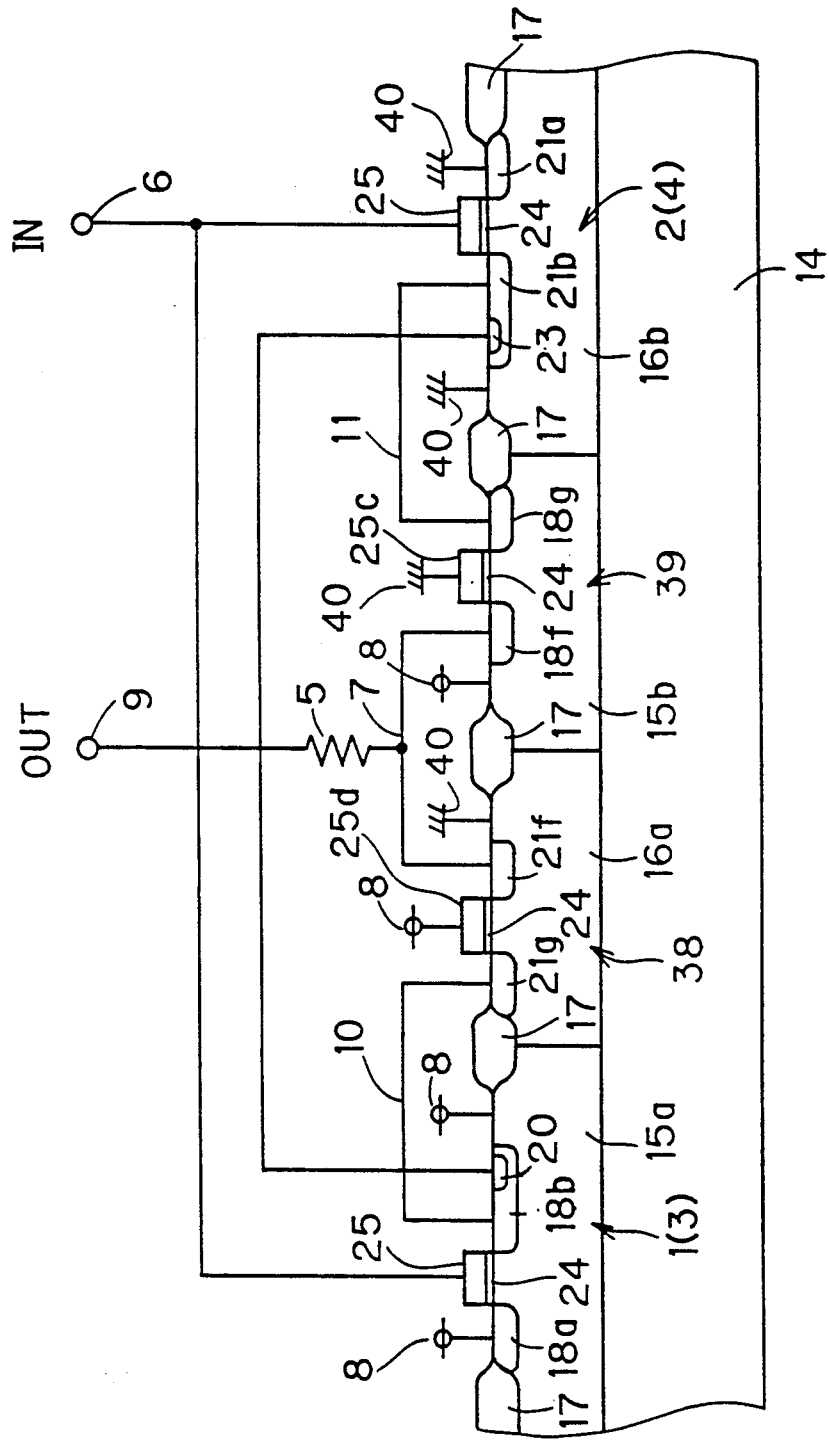
FIG. 11 is an explanatory diagram of a semiconductor device according to an eighth embodiment of the present invention.

FIG. 11 shows a semiconductor device according to an eighth embodiment of the present invention for implementing the inverter shown in FIG. 7. While FIG. 11 shows only a reference symbol of a resistor 5 similarly to the sixth embodiment, such a resistor can be easily formed on a silicon substrate 14 by a polysilicon or wiring metal material.

N-type wells 15a and 15b and P-type wells 16a and 16b are provided on the silicon substrate 14, so that a P-channel MOSFET 1 and an NPN transistor 3 are formed in the N-type well 15a and an N-channel MOSFET 2 and a PNP transistor 4 are formed in the P-type well 16b respectively.

These transistors are formed similarly to those of the third embodiment, so that the P-channel MOSFET 1 and the NPN transistor 3 have a P-type impurity region 18b in common and the N-channel MOSFET 2 and the PNP transistor 4 have an N-type impurity region 21b in common.

On the other hand, a P-channel MOSFET 39 and an N-channel MOSFET 38 are formed in the N-type well 15b and the P-type well 16a respectively. The P-channel MOSFET 39 has a P-type impurity region 18f serving as a source, a P-type impurity region 18g serving as a drain, a gate oxide film, 24, and a gate electrode 25c. The N-channel MOSFET 38 has an N-type impurity region 21f serving as a source, an N-type impurity region 21g serving as a drain, a gate oxide film 24, and a gate electrode 25d. The N-channel MOSFET 38 and the P-channel MOSFET 39 are isolated from other transistors by interlayer isolation films 17 respectively.

It is clearly understood that the semiconductor device having such a structure implements the operation of the logic circuit, which is an inverter, shown in FIG. 10. Namely, when a low potential point 40 (ground in this case) is connected to the gate electrode 25c and a high potential point 8 (5 V, for example) is connected to the gate electrode 25d, the respective ones of the P-channel MOSFET 39 and the N-channel MOSFET 38 enter ON states, whereby resistors are interposed between the nodes 7 and 10 as well as between the nodes 7 and 11. Therefore, if the N-channel MOSFET 38 and the P-channel MOSFET 39 are of depletion types, it is possible to obtain an inverter having an effect of enabling a high-speed operation, similarly to the first embodiment.

While the present invention has been shown and described in detail, the foregoing description is in all aspects illustrative and not restrictive. It is therefore understood that numerous modifications and variations can be devised without departing from the scope of the invention.

What is claimed is:

1. A logic circuit comprising:
   first power source means;
   second power source means;
   at least one input terminal;
   an output terminal;
   a node;
   a first bipolar transistor having a first electrode being connected to said first power source means, a second electrode being connected to said output terminal, and a first conductivity type control electrode;
   a second bipolar transistor having a first electrode being connected to said second power source means, a second electrode being connected to said output terminal, and a second conductivity type control electrode;
   at least one first MOS transistor having a first conductivity type first current electrode being connected to said control electrode of said first bipolar transistor, a first conductivity type second current electrode being connected to said first power source means, and a control electrode being connected to any of at least one of said at least one input terminal;
   at least one second MOS transistor having a second conductivity type first current electrode being connected to said control electrode of said second bipolar transistor, a second conductivity type second current electrode being connected to said second power source means, and a control electrode being connected to any of said at least one input terminal;
   first resistant means having an end being connected to said node, and another end being connected to said control electrode of said first bipolar transistor;
   second resistant means having an end being connected to said node, and another end being connected to said control electrode of said second bipolar transistor; and
   third resistant means having an end being connected to said node, and another end being connected to said output terminal.

2. A logic circuit in accordance with claim 1, wherein said at least one input terminal comprises a single input terminal,
   said at least one first MOS transistor comprises a single first MOS transistor having a first threshold voltage, and
   said at least one second MOS transistor comprises a single second MOS transistor having a second threshold voltage.

3. A logic circuit in accordance with claim 1, wherein said at least one input terminal comprises a plurality of input terminals,
   said at least one first MOS transistor comprises a plurality of first MOS transistors,
   said at least one second MOS transistor comprises a plurality of second MOS transistors, and
   numbers of said input terminals, said first MOS transistors and said second MOS transistors are equal to each other.

4. A logic circuit in accordance with claim 3, wherein said plurality of first MOS transistors are connected in parallel between said control electrode of said first bipolar transistor and said first power source means.

5. A logic circuit in accordance with claim 4, wherein said plurality of second MOS transistors are connected in series between said control electrode of said second bipolar transistor and said second power source means.

6. A logic circuit in accordance with claim 5, wherein said plurality of first MOS transistors, said plurality of second MOS transistors and said plurality of input terminals define a plurality of trios, and
   said control electrodes of said first and second MOS transistors and said input terminal defining the same said trio are connected in common.

7. A logic circuit in accordance with claim 2, wherein said first resistant means comprises a resistor.

8. A logic circuit in accordance with claim 7, wherein said second resistant means comprises a resistor.

9. A logic circuit in accordance with claim 2, wherein said first resistant means comprises a third MOS transistor having a third threshold voltage.

10. A logic circuit in accordance with claim 9, wherein
    said second resistant means comprises a fourth MOS transistor having a fourth threshold voltage.

11. A logic circuit in accordance with claim 9, wherein
    said third MOS transistor comprises a first current electrode of said second conductivity type being connected to said first electrode of said first MOS transistor, a second current electrode of said second conductivity type being connected to said node, and a control electrode being connected to said first power source means.

12. A logic circuit in accordance with claim 10, wherein
    said fourth MOS transistor comprises a first current electrode of said first conductivity type being connected to said first electrode of said second MOS transistor, a second current electrode of said first conductivity type being connected to said node, and a control electrode being connected to said second power source means.

13. A logic circuit in accordance with claim 11, wherein
    the absolute value of said third threshold value is smaller than that of said first threshold voltage.

14. A logic circuit in accordance with claim 12, wherein
    the absolute value of said fourth threshold voltage is smaller than that of said second threshold voltage.

15. A semiconductor device comprising:
    a semiconductor substrate having a first conductivity type first semiconductor region for formation of elements and a second conductivity type second semiconductor region for formation of elements;
    a first MOS transistor being formed in said second semiconductor region and having a first conductivity type first current electrode, a first conductivity type second current electrode, and a control electrode;

a first bipolar transistor being formed in said second semiconductor region and having a second conductivity type first electrode, a second conductivity type second electrode, and a first conductivity type control electrode;

a second MOS transistor being formed in said first semiconductor region and having a second conductivity type first current electrode, a second conductivity type second current electrode, and a control electrode;

a second bipolar transistor being formed in said first semiconductor region and having a first conductivity type first electrode, a first conductivity type second electrode, and a second conductivity type control electrode;

first resistant means;

second resistant means; and third resistant means, both said first current electrode of said first MOS transistor and said control electrode of said first bipolar transistor being connected to an end of said first resistant means, both said first current electrode of said second MOS transistor and said control electrode of said second bipolar transistor being connected to an end of said second resistant means, both said second current electrode of said first bipolar transistor and said second current electrode of said second bipolar transistor being connected to an end of said third resistant means, and the other ends of said first, second and third resistant means being connected in common.

16. A semiconductor device in accordance with claim 15, wherein both said control electrode of said first bipolar transistor and said first current electrode of said first MOS transistor are formed by a first condcutivity type third semiconductor region being selectively formed in said second semiconductor region.

17. A semiconductor device in accordance with claim 16, wherein both said control electrode of said second bipolar transistor and said first current electrode of said second MOS transistor are formed by a second conductivity type fourth semiconductor region being selectively formed in said first semiconductor region.

18. A semiconductor device in accordance with claim 17, further comprising a third MOS transistor being formed in said second semiconductor region and having a first conductivity type first current electrode, a first conductivity type second current electrode and a control electrode, both said first current electrode of said third MOS transistor and said second current electrode of said first MOS transistor being formed by said third semiconductor region.

19. A semiconductor device in accordance with claim 18, further comprising a fourth MOS transistor being formed in said first semiconductor region and having a second conductivity type first current electrode, a second conductivity type second current electrode and a control electrode, both said first current electrode of said fourth MOS transistor and said second current electrode of said second MOS transistor being formed by said fourth semiconductor region.

20. A semiconductor device in accordance with claim 17, further comprising a first conductivity type fifth semiconductor region, said first resistant means comprising a third MOS transistor being selectively formed in said fifth semiconductor region and having a second conductivity type first current electrode, a second conductivity type second current electrode, and a control electrode being connected to said first power source means.

21. A semiconductor device in accordance with claim 20, further comprising a second conductivity type sixth semiconductor region, said second resistant means comprising a fourth MOS transistor being selectively formed in said sixth semiconductor region and having a first conductivity type first current electrode, a first conductivity type second current electrode, and a control electrode being connected to said second power source means.

22. A semiconductor device comprising:

a semiconductor substrate having a first conductivity type first semiconductor region for formation of elements and a second conductivity type second semiconductor region for formation of elements;

a first MOS transistor being formed in said second semiconductor region and having a first conductivity type first current electrode, a first conductivity type second current electrode, and a control electrode;

a first bipolar transistor being formed in said second semiconductor region and having a second conductivity type first electrode, a second conductivity type second electrode, and a first conductivity type control electrode;

a second MOS transistor being formed in said first semiconductor region and having a second conductivity type first current electrode, a second conductivity type second current electrode, and a control electrode;

a second bipolar transistor being formed in said first semiconductor region and having a first conductivity type first electrode, a first conductivity type second electrode, and a second conductivity type control electrode;

first resistant means;

second resistant means; and third resistant means, said first resistant means, said control electrode of said first bipolar transistor and said first current electrode of said first MOS transistor being formed by a first conductivity type third semiconductor region being selectivity formed in said second semiconductor region, said second resistance means, said control electrode of said second bipolar transistor and said first current electrode of said second MOS transistor being formed by a second conductivity type fourth semiconductor region being selectively formed in said first semiconductor region, an end of said third resistant means being connected to said second electrodes of said first and second bipolar transistors in common, and the other end being connected to said third and fourth semiconductor regions in common.

* * * * *